(12) United States Patent
Lee et al.

(10) Patent No.: US 11,874,595 B2
(45) Date of Patent: Jan. 16, 2024

(54) RETICLE CONSTRUCTIONS AND PHOTO-PROCESSING METHODS

(71) Applicant: Micron Technology, Inc., Boise, ID (US)

(72) Inventors: Chung-Yi Lee, Boise, ID (US); Reha M. Bafrali, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 407 days.

(21) Appl. No.: 17/160,891

(22) Filed: Jan. 28, 2021

(65) Prior Publication Data

US 2022/0066313 A1 Mar. 3, 2022

Related U.S. Application Data

(60) Provisional application No. 63/071,263, filed on Aug. 27, 2020.

(51) Int. Cl.
| | | |
|---|---|---|
| *G03F 1/38* | (2012.01) | |
| *G03F 7/00* | (2006.01) | |
| *G03F 1/36* | (2012.01) | |
| *H10B 41/27* | (2023.01) | |
| *H10B 43/27* | (2023.01) | |

(52) U.S. Cl.
CPC ............. *G03F 1/38* (2013.01); *G03F 1/36* (2013.01); *G03F 7/70* (2013.01); *H10B 41/27* (2023.02); *H10B 43/27* (2023.02)

(58) Field of Classification Search
CPC ..... G03F 1/38; G03F 1/36; G03F 7/70; G03F 7/70441; G03F 7/70558; G03F 1/70; G03F 1/76; H10B 41/27; H10B 43/27; H10B 41/41; H10B 43/40; H10B 41/35; H10B 43/35

See application file for complete search history.

(56) References Cited

U.S. PATENT DOCUMENTS

| | | | | |
|---|---|---|---|---|
| 6,893,801 B2 * | 5/2005 | Inoue | ........................ | G03F 1/36 430/311 |
| 7,657,865 B2 * | 2/2010 | Yamazoe | ............ | G03F 7/70466 716/54 |
| 7,843,731 B2 * | 11/2010 | Park | .................... | G11C 16/0458 365/185.11 |

(Continued)

FOREIGN PATENT DOCUMENTS

EP 1467256 A1 * 10/2004 ............... G03F 1/70

*Primary Examiner* — Christopher G Young
*Assistant Examiner* — Moriah S. Smoot
(74) *Attorney, Agent, or Firm* — Wells St. John P.S.

(57) ABSTRACT

Some embodiments include a reticle which includes first pattern features and second pattern features. A first optimal dose of actinic radiation is associated with the first pattern features and a second optimal dose of the actinic radiation is associated with the second pattern features. The second pattern features are larger than the first pattern features. Each of the second pattern features has a configuration which includes a central region laterally surrounded by an outer region, with the central region being of different opacity than the outer region. The configurations of the second pattern features balance the second optimal dose of the actinic radiation to be within about 5% of the first optimal dose of the actinic radiation. Some embodiments include photo-processing methods.

19 Claims, 14 Drawing Sheets

(56) References Cited

U.S. PATENT DOCUMENTS

| | | | | |
|---|---|---|---|---|
| 8,617,775 | B2* | 12/2013 | Solak | G03F 1/70 |
| | | | | 430/326 |
| 10,593,695 | B1* | 3/2020 | Kim | H01L 29/40114 |
| 2004/0169206 | A1* | 9/2004 | Kim | H01L 23/564 |
| | | | | 257/210 |
| 2004/0265710 | A1* | 12/2004 | Kohler | G03F 7/70466 |
| | | | | 430/394 |
| 2019/0198509 | A1* | 6/2019 | Kim | H01L 29/40117 |

* cited by examiner

RETICLE CONSTRUCTIONS AND PHOTO-PROCESSING METHODS

RELATED PATENT DATA

This application claims priority to and the benefit of U.S. Provisional Patent Application Ser. No. 63/071,263, filed Aug. 27, 2020, the disclosure of which is incorporated herein by reference.

TECHNICAL FIELD

Reticle constructions, photo-processing methods, integrated circuit fabrication (e.g., fabrication of NAND memory).

BACKGROUND

Photolithography is commonly used during formation of integrated circuits on semiconductor wafers. More specifically, a form of radiant energy is passed through a radiation-patterning tool and onto a radiation-sensitive material associated with a semiconductor wafer. The radiant energy can be referred to as actinic energy, and may be light in the ultraviolet (UV) range, deep UV range, etc. The radiation-sensitive material is a photo-imagable material, such as, for example, photoresist.

The radiation-patterning tool may be referred to as a photomask or a reticle. The term "photomask" is traditionally understood to refer to masks which define a pattern for an entirety of a wafer, and the term "reticle" is traditionally understood to refer to a patterning tool which defines a pattern for only a portion of a wafer. However, the terms "photomask" (or more generally "mask") and "reticle" are frequently used interchangeably in modern parlance, so that either term can refer to a radiation-patterning tool that encompasses either a portion or an entirety of a wafer. For purposes of interpreting this disclosure and the claims that follow, the term "reticle" is to be understood to be generic to traditional photomasks and reticles unless expressly stated otherwise.

Some of the applications discussed in the embodiments below pertain to memory fabrication (e.g., NAND memory fabrication). FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as word-lines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 is those transistors within a NAND string 206 coupled to a given bitline 228. A row of the charge-storage transistors 208 is those transistors commonly coupled to a given wordline 202.

It is often desired to simultaneously pattern features of different sizes during fabrication of integrated circuitry (e.g., integrated memory). However, such patterning is difficult at least in part due to difficulties in forming reticles suitable for effectively utilizing a single dose of actinic radiation to pattern features of different sizes. It is desired to develop new reticle configurations, and new methods of utilizing such reticle configurations for photo-processing during fabrication of integrated circuitry.

DETAILED DESCRIPTION OF THE ILLUSTRATED EMBODIMENTS

Some embodiments include reticles having first and second patterning features, with the second patterning features being larger than the first patterning features. The second patterning features may be configured to balance an optimal dose of actinic radiation associated therewith so that the optimal dose of the actinic radiation associated with the second features is about the same as that associated with the first features, even though the first patterning features are smaller than the second patterning features. Some embodiments include photo-processing (photo-patterning) methods. Example embodiments are described with reference to FIGS. 5-15.

Figure 5:
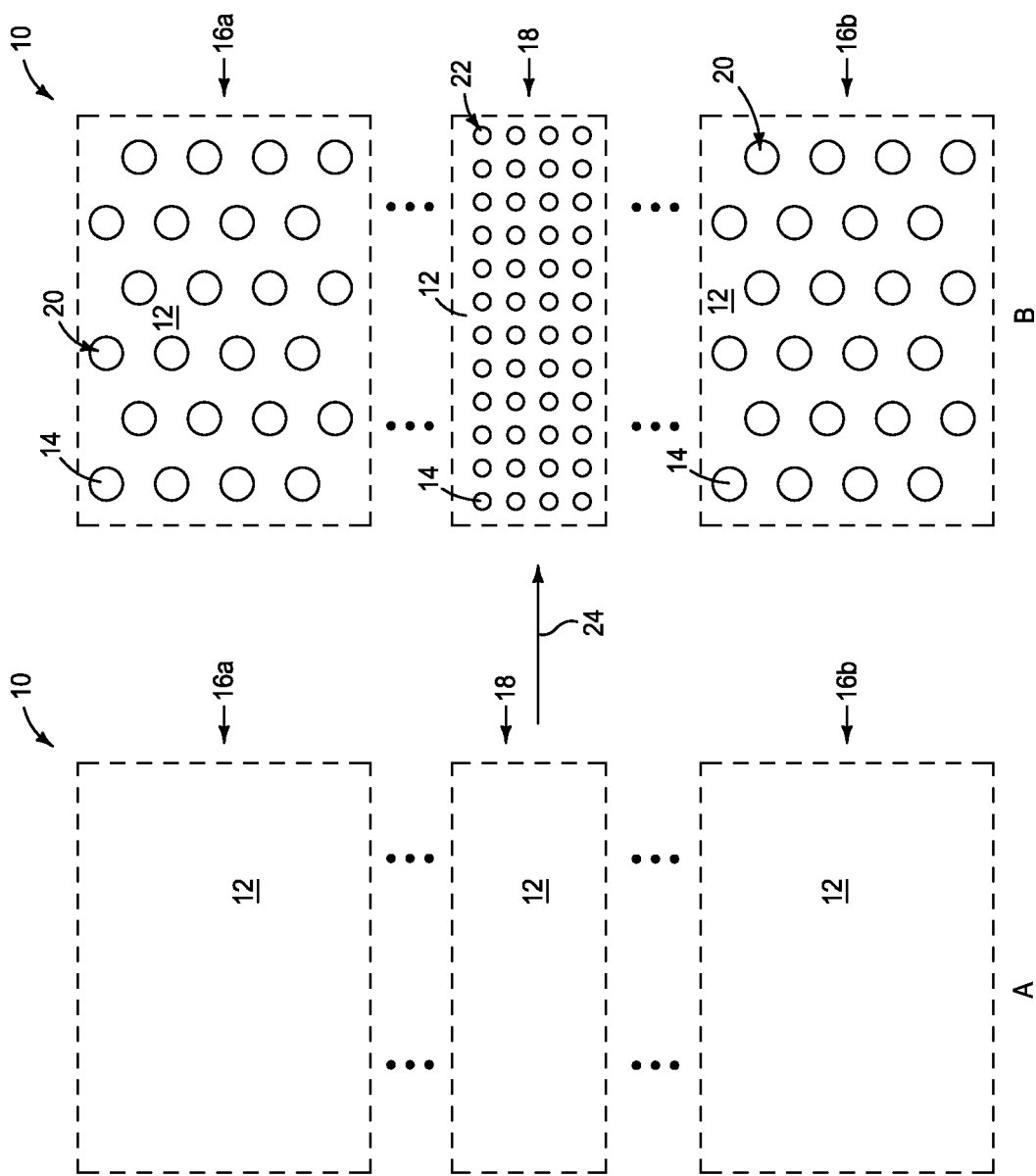
FIG. 5 shows diagrammatic top views of a photoimageable material (left side of the figure), and a pattern formed within the photoimageable material (right side of the figure).

Referring to FIG. 5, an assembly 10 is shown at an initial process stage "A" on the left side of the figure, and at a subsequent process stage "B" on the right side of the figure.

Figure 1:
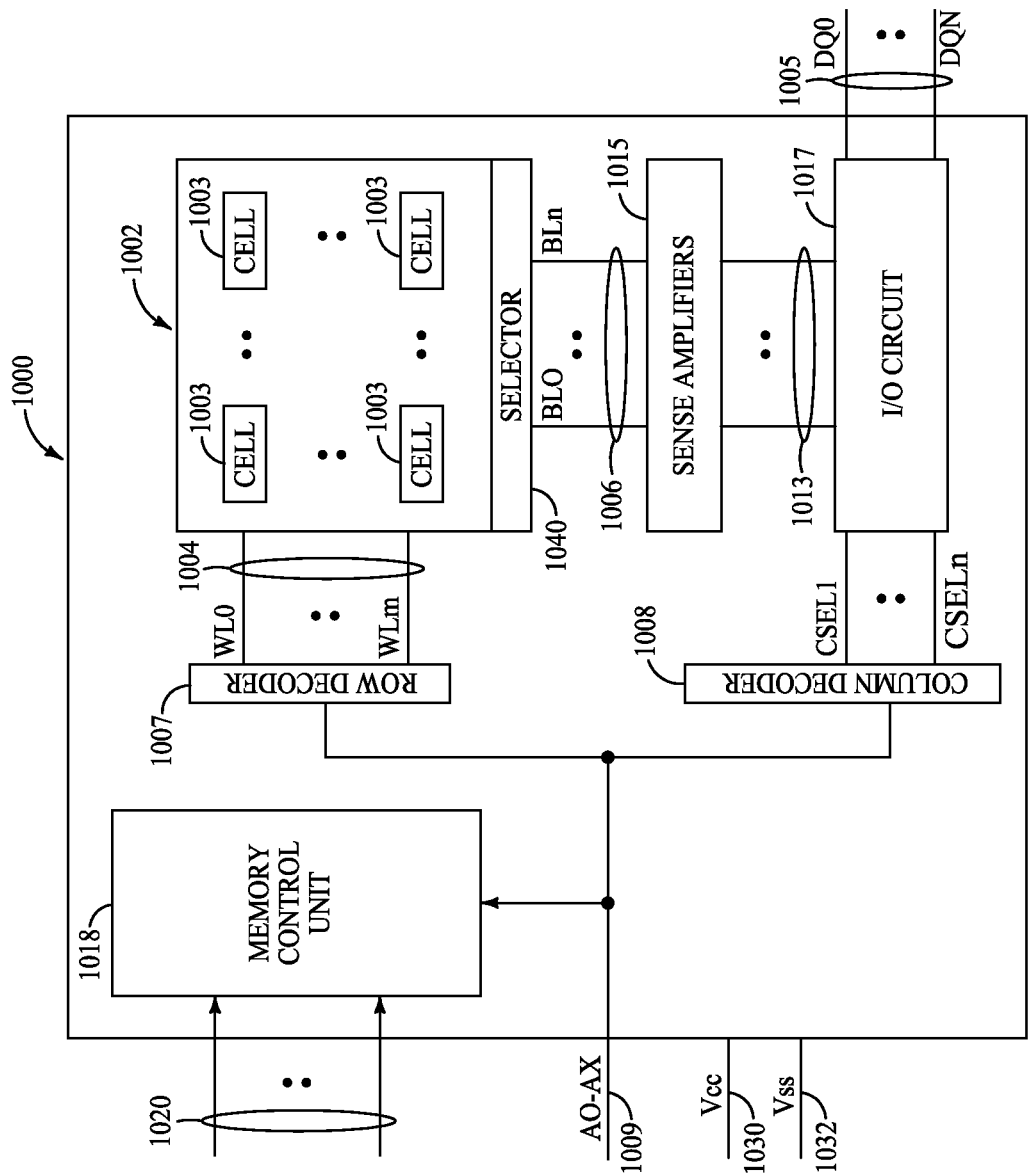
FIG. 1 shows a block diagram of a prior art memory device having a memory array with memory cells.
Figure 2:
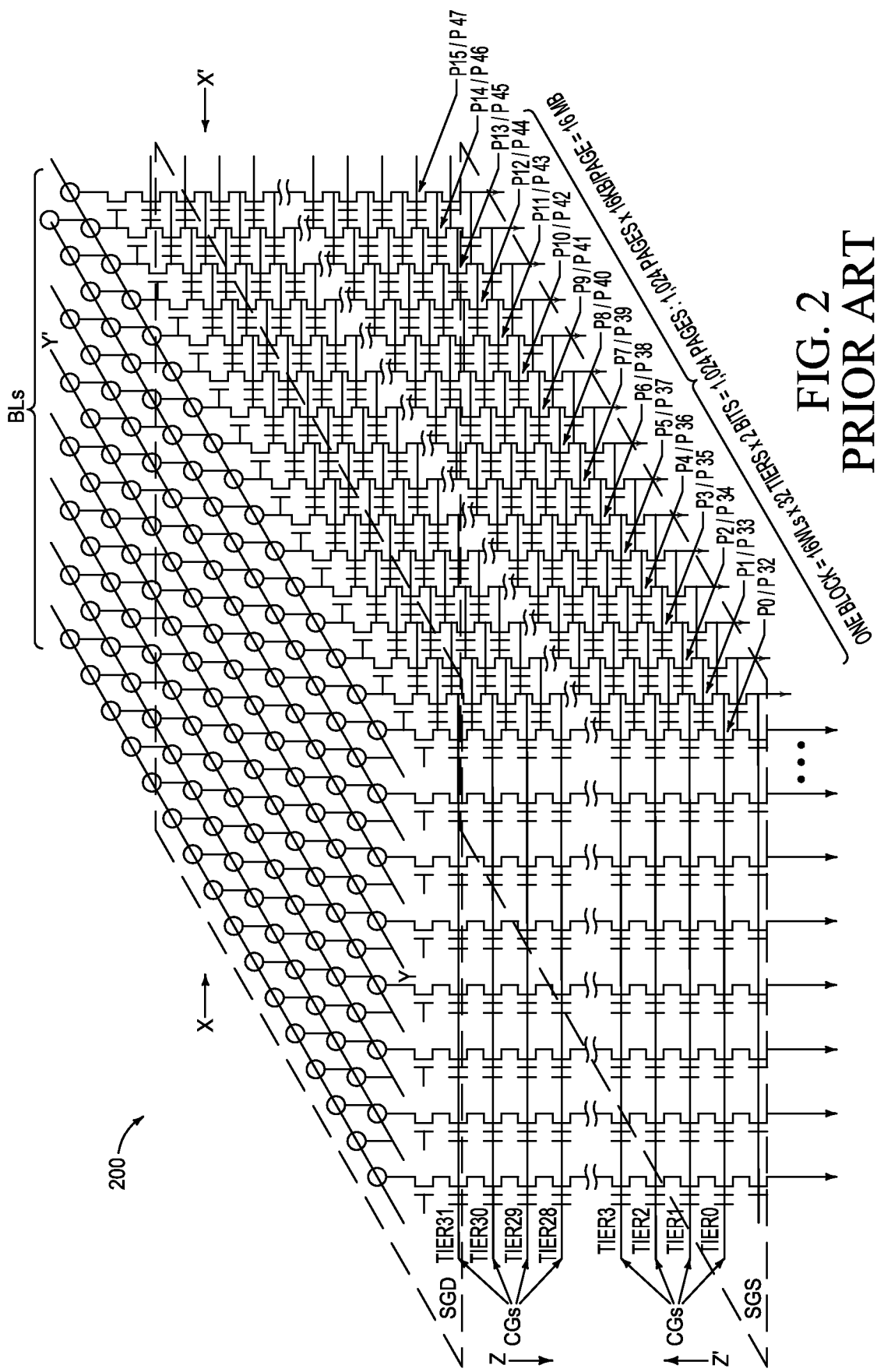
FIG. 2 shows a schematic diagram of a prior art memory array in the form of a 3D NAND memory device.
Figure 3:
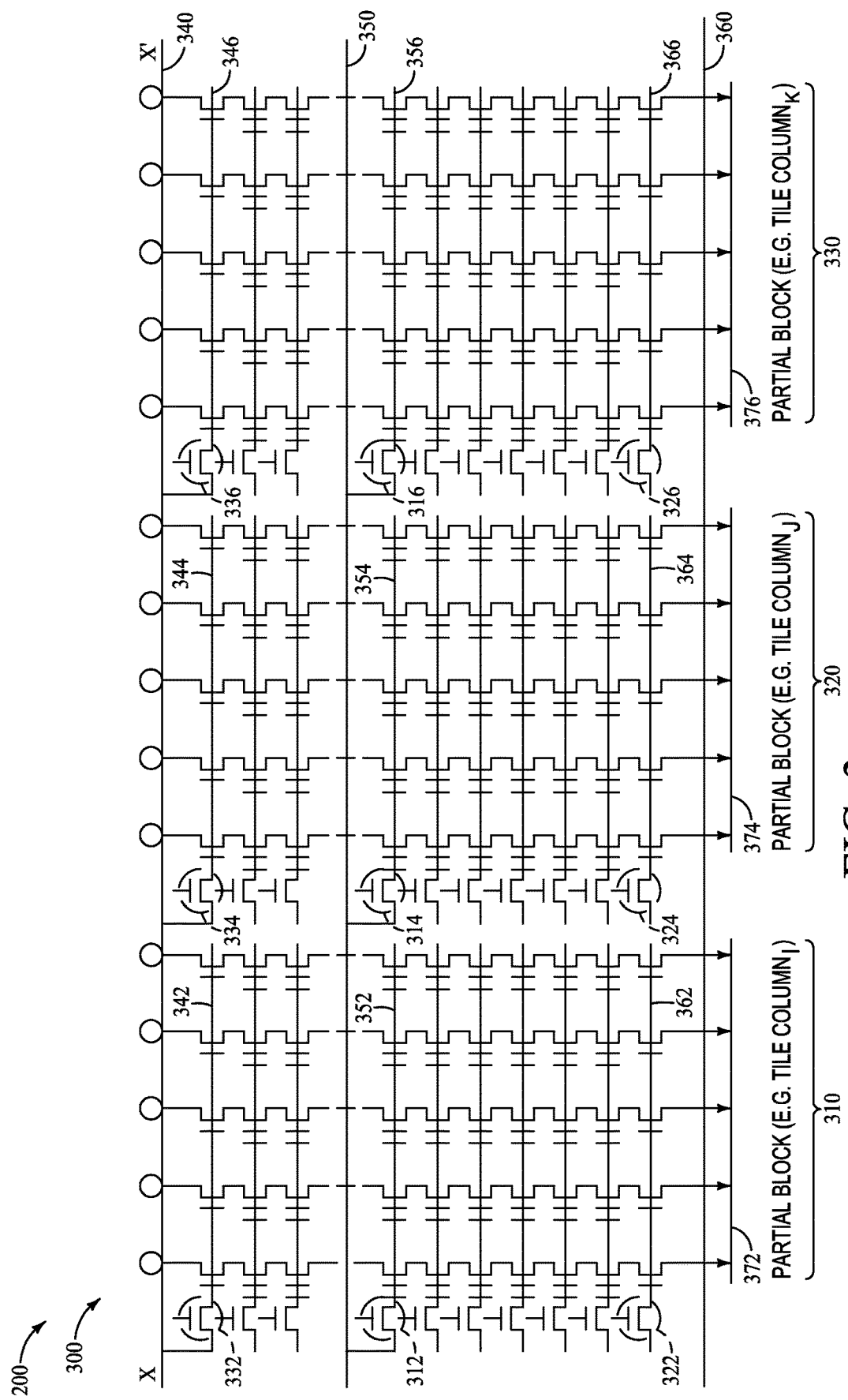
FIG. 3 shows a cross-sectional view of the prior art 3D NAND memory device of FIG. 2 in an X-X' direction.
Figure 4:
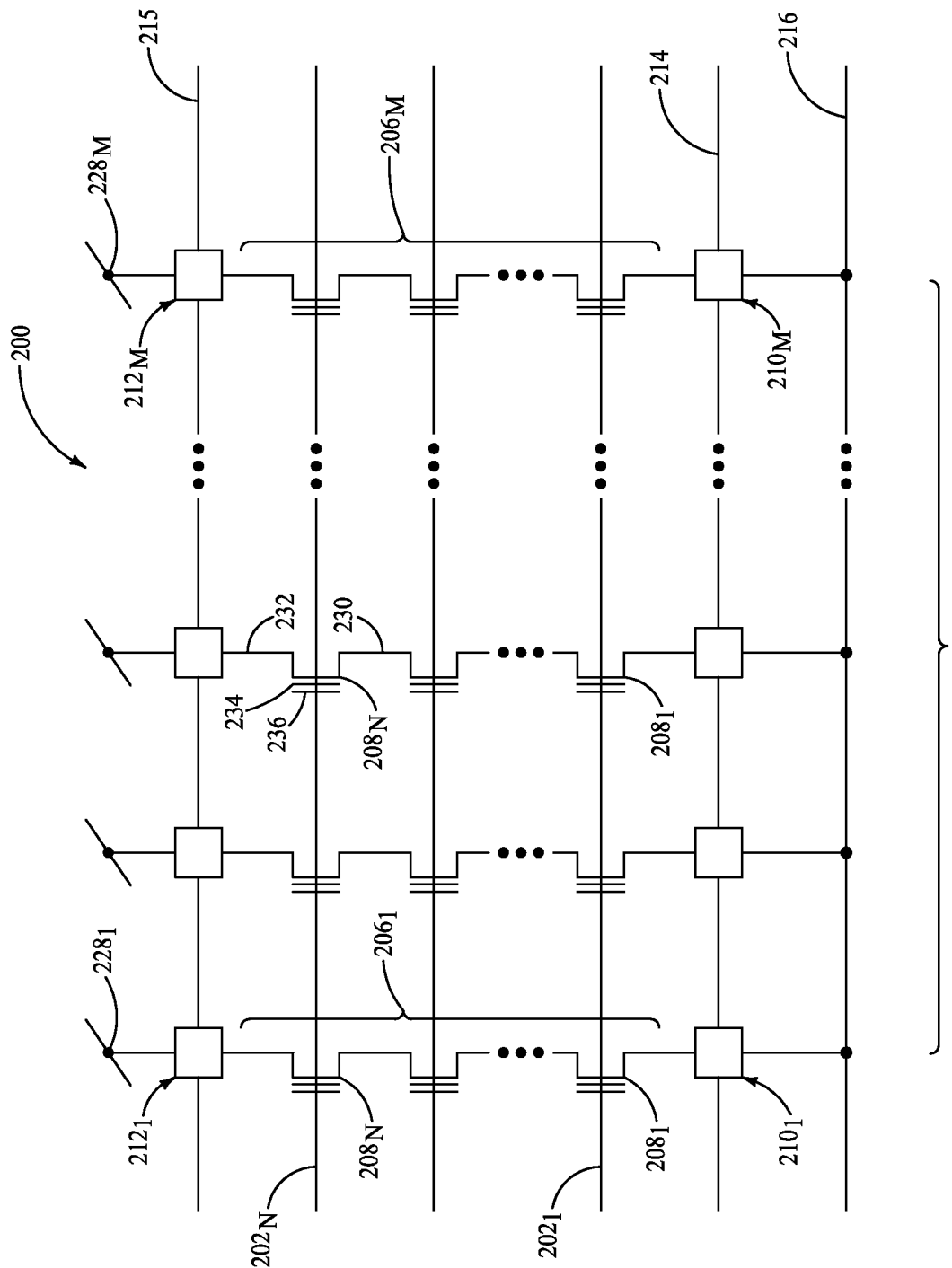
FIG. 4 is a schematic diagram of a prior art NAND memory array.

The assembly 10 at the process stage "A" includes photoimageable material 12 formed over an underlying substrate 14 (with regions of the substrate 14 being visible at the process stage "B"). The assembly 10 includes a pair of memory array regions 16a and 16b, and includes another region 18 between the memory array regions 16a and 16b. The regions 16a and 16b eventually include memory cells. The memory cells may be NAND memory cells which are formed along the vertically-extending channel regions of the type described above with reference to FIG. 2, with the memory cells along a common channel corresponding to a string of the memory cells (e.g., a NAND string). Each of the memory cells of an individual string may be within one of the tiers 0-31 of FIG. 2. The global control gate (CG) lines (wordlines) of FIG. 2 extend along the tiers and laterally between the memory cells, with the wordlines also extending to row decoder circuitry as described above with reference to FIG. 1.

In some embodiments, the openings 20 of the process stage "B" are utilized to pattern locations for vertically-extending channel-material-pillars within the memory arrays 16a and 16b.

In some embodiments, the region 18 may correspond to an interconnect region (for instance, may include a staircase region), and may be utilized for forming connections to the wordlines. Such electrical connections may extend to the row decoder circuitry and to associated wordline driver circuitry. Alternately and/or additionally, interconnects formed within the region 18 may extend to other components associated with NAND memory, such as, for example, source structures, SGS devices, etc. Alternatively and/or additionally, structures analogous to functional interconnects may be formed within the region 18 and may be utilized for structural support only rather than for electrical connections (i.e., at least some of the structures formed within the region 18 may correspond to so-called "dummy" structures).

In the illustrated embodiment of FIG. 5, the interconnect region 18 may be considered to be proximate to the memory array regions 16a and 16b, and to be between the illustrated memory array regions.

The photoimageable material 12 is exposed to patterned actinic radiation to form first openings 20 within the memory array regions 16a and 16b, and to form second openings 22 within the intermediate region 18. In some embodiments, the first openings 20 may be considered to correspond to first target features formed within the photoimageable material 12, and the second openings 22 may be considered to correspond to second target features formed within the photoimageable material. Notably, the second target features 22 are much smaller than the first target features 20. In some embodiments, each of the first target features 20 may occupy an area which is at least about 50% bigger than an area occupied by each of the target features 22, at least about twice as large as the area occupied by each of the target features 22, etc.

In the shown embodiment, the first and second target features 20 and 22 are substantially circular features (i.e., are circular to within reasonable tolerances of fabrication and measurement). In other embodiments, the first and second target features 20 and 22 may have other suitable shapes including, for example, elliptical, polygonal, etc.; and may or may not have the same shapes as one another.

The photo-processing utilized to pattern the photoimageable material 12 is diagrammatically illustrated with an arrow 24 in FIG. 5. Such photo-processing may utilize an appropriate reticle as described with reference to FIG. 6.

Figure 6:
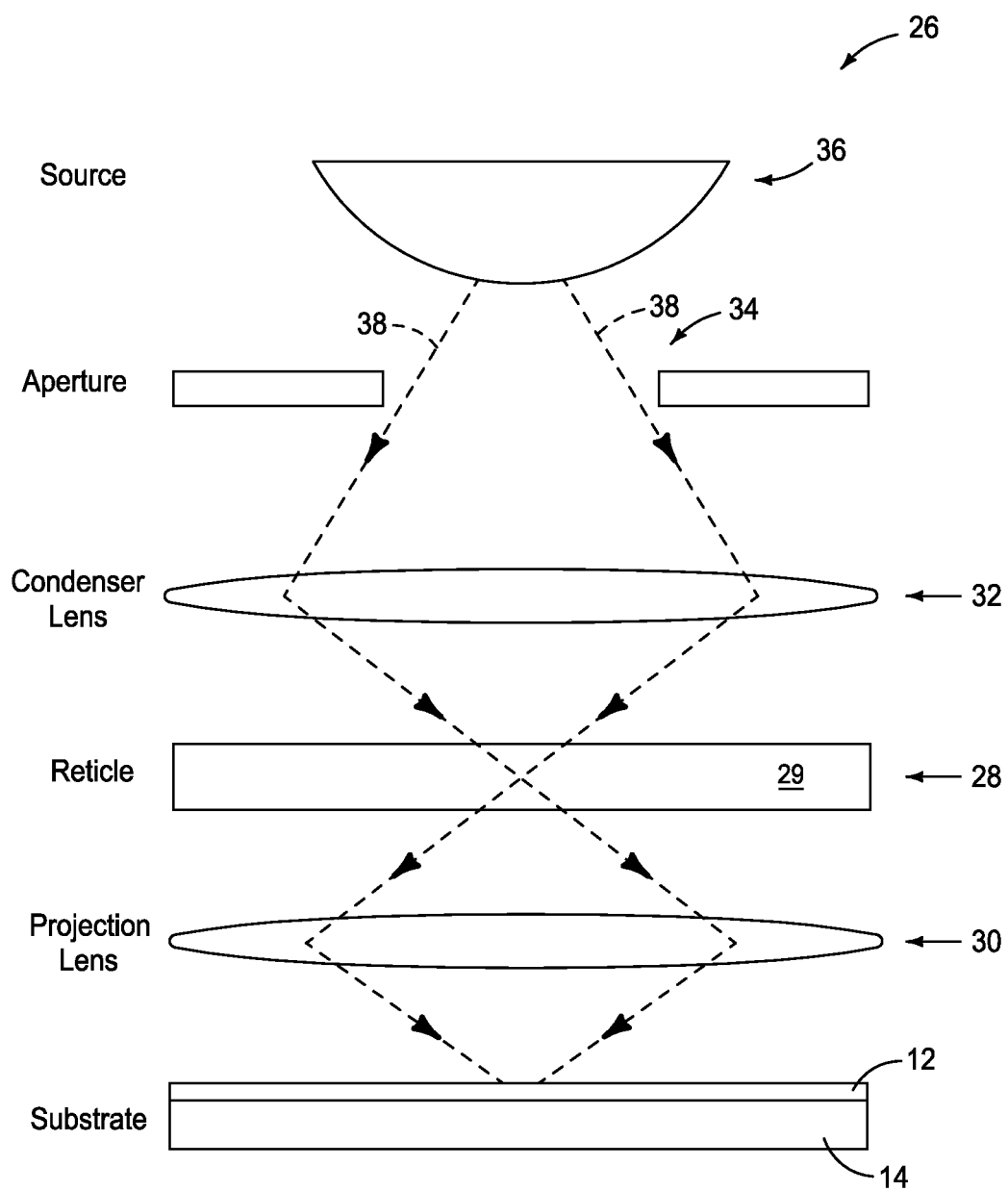
FIG. 6 is a diagrammatic side view of an example apparatus configured for a photo-processing.

Specifically, FIG. 6 shows the substrate 14 having the photoimageable material 12 thereover. The substrate is oriented relative to a photo-processing apparatus 26. The apparatus 26 includes a reticle 28, a pair of lenses 30 and 32 (i.e., a projection lens and a condenser lens), an aperture 34, and a source 36 which generates electromagnetic radiation (with the electromagnetic radiation being diagrammatically illustrated with dashed lines 38).

The electromagnetic radiation of FIG. 6 may be referred to as actinic radiation in that it is of a suitable wavelength to cause chemical changes within the photoimageable material 12. Such chemical changes render exposed regions of the photoimageable material to be either more soluble in developer as compared to unexposed regions (in applications in which the photoimageable material 12 is a positive resist), or less soluble in developer as compared to unexposed regions (in applications in which the photoimageable material 12 is a negative resist).

The reticle 28 comprises a bulk material 29, and comprises pattern features (not shown) which are utilized to pattern the openings 20 and 22 of FIG. 5. The pattern features may be, for example, openings extending into the bulk material 29, opaque regions over the bulk material 29, and/or other configurations. The bulk material 29 may comprise any suitable composition(s), and in some embodiments may comprise silicon (e.g., monocrystalline silicon) having suitable transmissivity.

Difficulties are encountered in attempting to make pattern features (patterning features) suitable for forming both the large openings 20 and the small openings 22 (FIG. 5) in that the optimal dose of actinic radiation for reticle features associated with the large openings 22 is often different than that for reticle features associated with the small openings 20.

Figure 7:
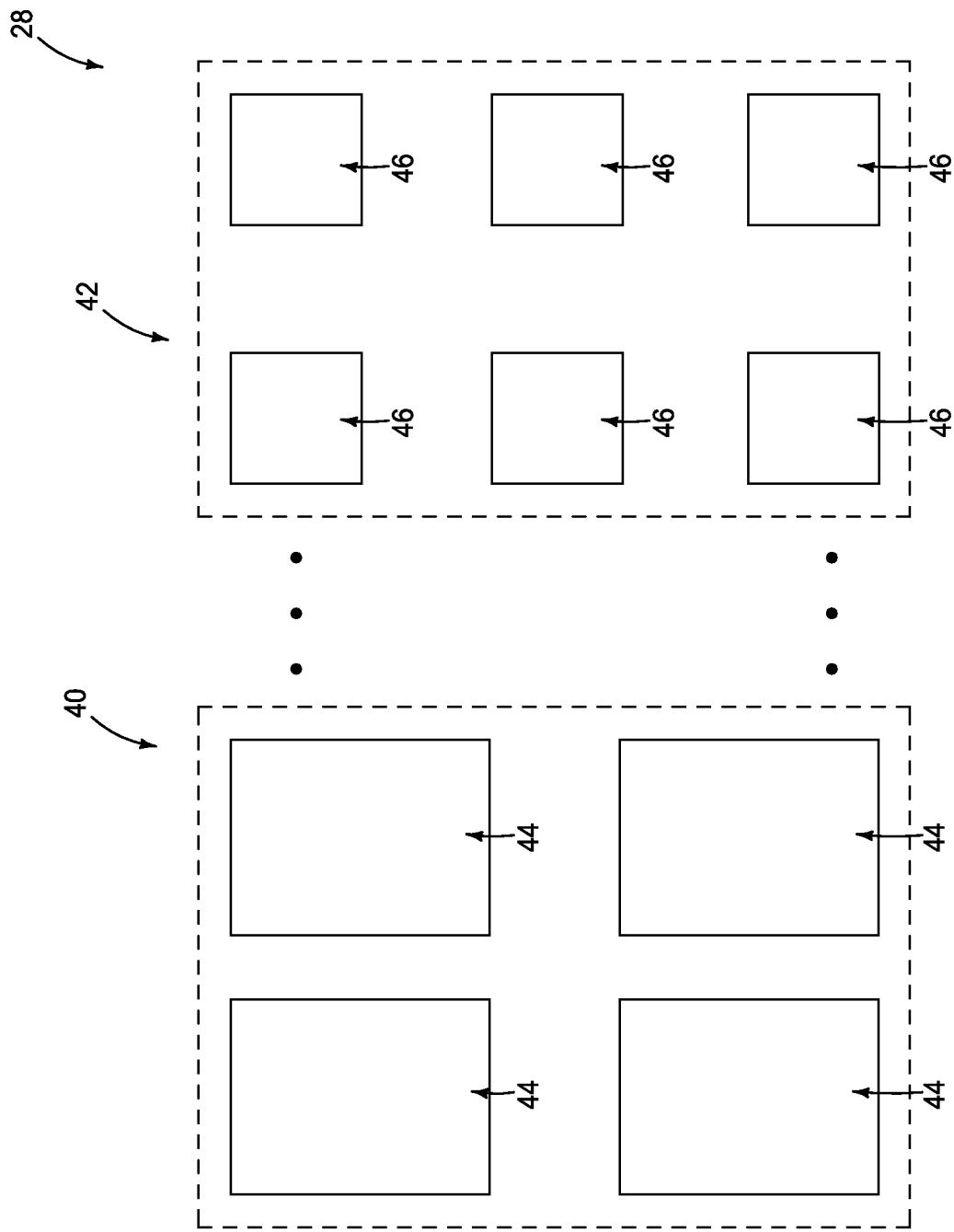
FIG. 7 is a diagrammatic top view of example regions of an example reticle.

FIG. 7 shows regions 40 and 42 of the reticle 28. The region 40 comprises large pattern features 44 configured to pattern large target features (e.g., the openings 20 of FIG. 5) and the region 42 comprises small pattern features 46 configured to pattern small target features (e.g., the openings 22 of FIG. 5). The features 44 are shown as rectangles and the features 46 are shown as squares. In other embodiments, the features 44 and 46 may have the same shape as one another (e.g., both may be squares, both may be rectangles, etc.). If the features 44 and 46 are both utilized to pattern circular target features in photoimageable material (as shown in FIG. 5), then both of the features 44 and 46 may be square.

Figure 9:
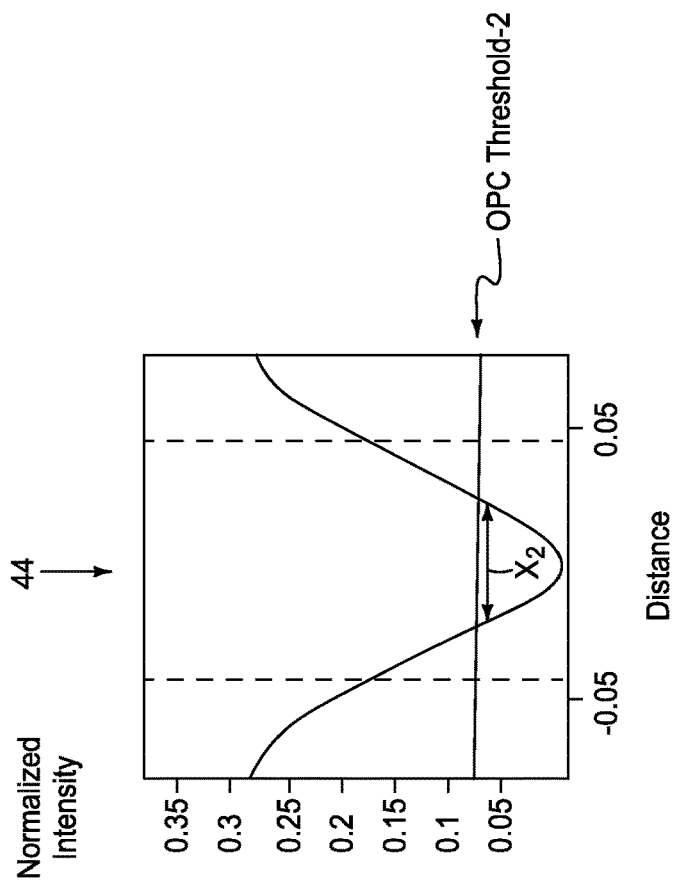
FIGS. 8 and 9 a graphical views of relationships of intensity versus distance for actinic radiation passing through the example regions of the example reticle of FIG. 7.
Figure 8:
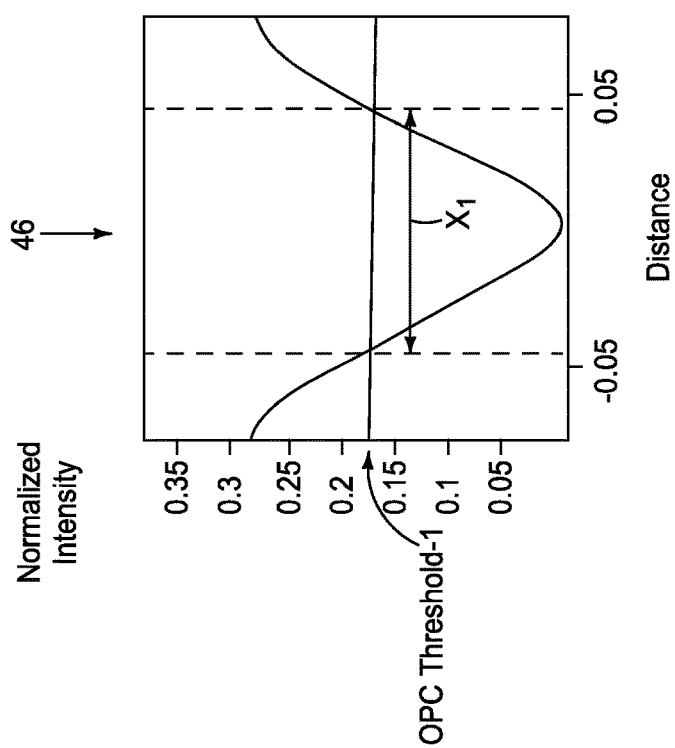

FIGS. 8 and 9 graphically illustrate optical proximity correction (OPC) threshold levels for the large features 44 and the small features 46 (FIG. 7). The OPC threshold level for the small feature 46 is illustrated as OPC Threshold-1, and is shown as a dimension $X_1$; and the OPC threshold level for the large feature 44 is illustrated as OPC Threshold- 2, and is shown as a dimension $X_2$. Notably, $X_2$ is much less than $X_1$. The OPC threshold level of a pattern feature is inversely correlated with the optimal dose appropriate for such pattern feature. Accordingly, the substantial difference between $X_1$ and $X_2$ renders it difficult to appropriately optimize a single dose for both of the pattern features 44 and 46. Instead, a compromise dose is utilized in conventional applications, with the compromise dose being suboptimal for both of the pattern features 44 and 46.

An aspect of some of the embodiments presented herein is a recognition that the optimal dose for the larger pattern feature 44 may be modified by changing the configuration of such feature to include an inrigger (i.e., a central region having different opacity than a remainder of the feature) while still maintaining the ability of the modified pattern feature to generate a desired target feature when actinic radiation is passed through the modified pattern feature. The inrigger may be considered to be an example of a Sub-Resolution Assist Feature (SRAF).

Figure 10:
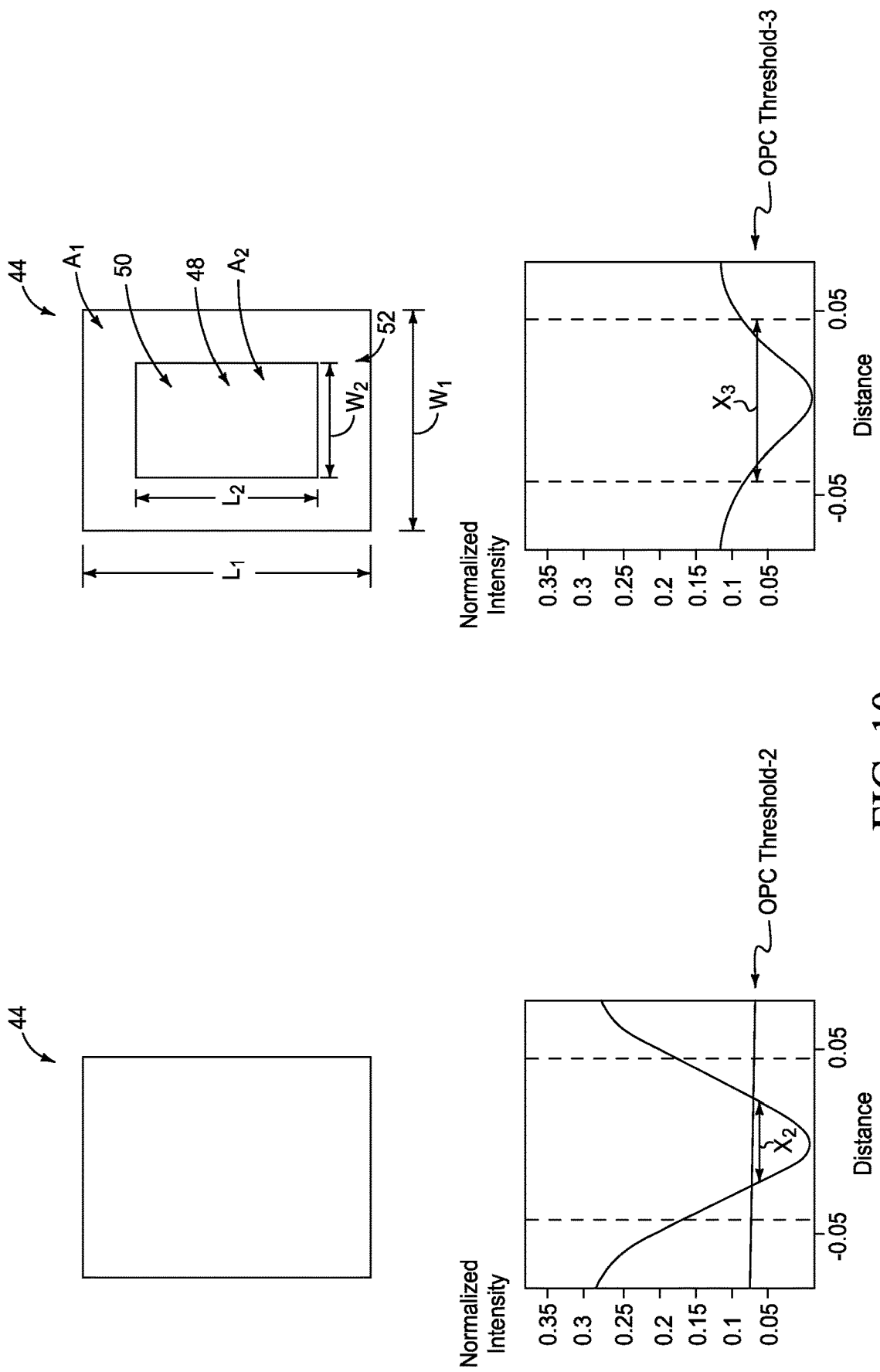
FIG. 10 shows one of the regions of FIG. 7 modified to alter the relationship of intensity versus distance for radiation passing through said one of the regions, and shows graphical relationships of intensity versus distance for the actinic radiation passing through said one of the regions before and after the modification.
Figure 11:
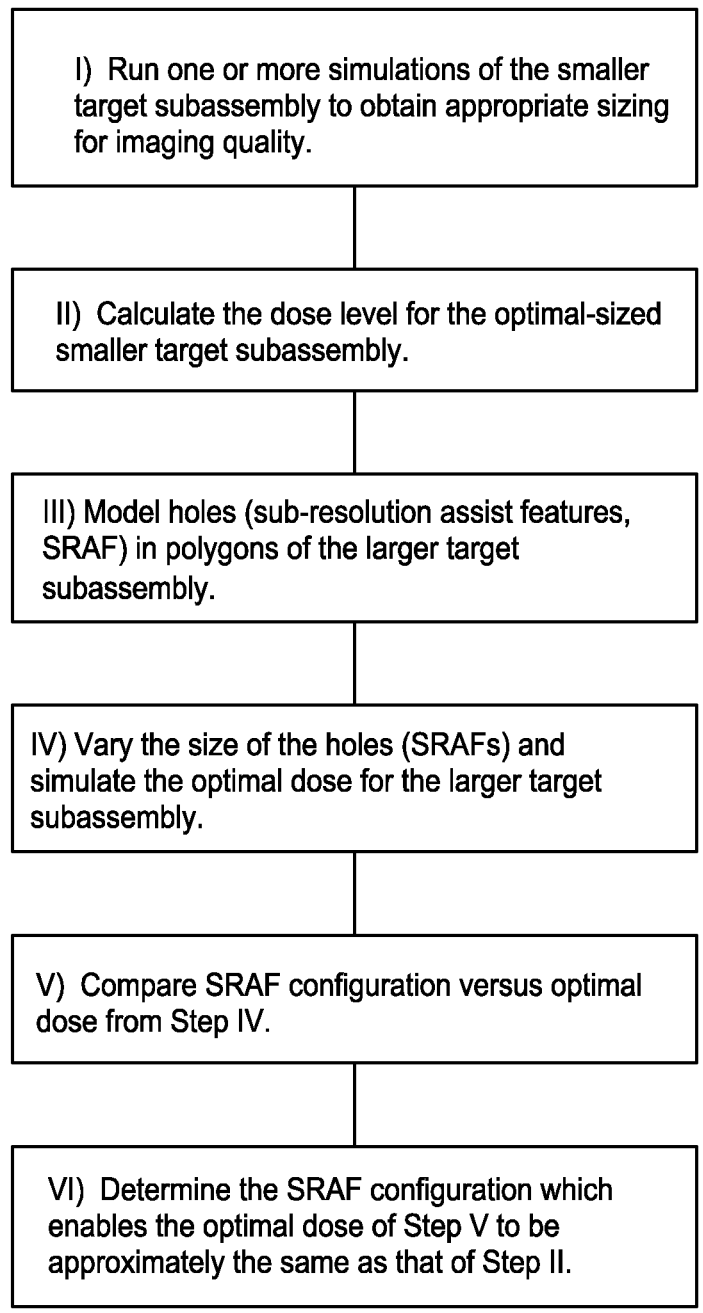
FIG. 11 is a flow-chart description of an example process of an example embodiment.

FIG. 10 diagrammatically illustrates the formation of an inrigger 48 within the pattern feature 44. Specifically, the left side of FIG. 10 shows the original (unmodified) pattern feature 44, together with the graph showing the OPC threshold level (the dimension $X_2$) associated with such feature. The right side of FIG. 10 shows the feature 44 modified to include an inrigger 48, and shows that the modified pattern feature 44 has an OPC threshold level (OPC Threshold-3) with a dimension of $X_3$, where the dimension $X_3$ is very similar to the dimension $X_1$ of the OPC threshold level for the small pattern feature 46 (FIG. 8).

In some embodiments, the optimal dose of the actinic radiation for the modified large pattern feature 44 may be within about 5% of the optimal dose of the actinic radiation for the small pattern feature 46. In other words, if the small pattern feature has an optimal dose $D_1$, than the modified large pattern feature 44 may have an optimal dose within a range of from about $(D_1-0.5D_1)$ to about $(D_1+0.5D_1)$. The optimal doses may be measured in any suitable units, such as, for example, millijoules/centimeter$^2$, (mJ/cm$^2$). In some embodiments, the modified large pattern feature 44 may have an optimal dose of the actinic radiation within about 1% of the optimal dose for the small pattern feature 46, within about 0.3% of the optimal dose for the small pattern feature, or substantially the same as the optimal dose of the small pattern feature (where the term "substantially the same" means the same to within reasonable tolerances of fabrication and measurement).

The inrigger 48 may be considered to correspond to a central region 50 of the modified pattern feature 44. An outer region 52 of the pattern feature 44 laterally surrounds the central region 50. The central region 50 has a different opacity than the outer region 52. The central region may have a lower opacity (higher transmittance, higher transparency) than the outer region, or a higher opacity (lower transmittance, lower transparency) depending on whether the reticle is utilized for patterning positive resist or negative resist.

The modified pattern feature 44 may be considered to comprise a first area $A_1$. In the illustrated embodiment of FIG. 10 in which the modified pattern feature 44 is a rectangle, such area may be calculated as length ($L_1$) times width ($W_1$); i.e., $A_1=L_1 \times W_1$. The central region 50 of the modified pattern feature 44 may be considered to comprise a second area $A_2$ which may be calculated as $L_2 \times W_2$ in the illustrated embodiment. In some embodiments, the second area $A_2$ may comprise from about 5% to about 95% of the first area $A_1$, may comprise from about 20% to about 60% of the first area $A_1$, etc.

The configuration (e.g., size, shape, composition, etc.) of the inriggers 48 (central regions 50) of the modified pattern features 44 may be determined with any suitable methodology. An example method is described with reference to FIG. 11.

At an initial step I, at least one simulation of the smaller target subassembly (i.e., the small feature patterns 46, which may be referred to as first feature patterns in some embodiments) is run to obtain appropriate sizing of the smaller patterns for imaging quality.

At a subsequent step II, a dose level for the optimal-sized smaller targets of the assembly (i.e., the first feature patterns 46) is determined. Such a dose level may be referred to as an optimal dose of actinic radiation for the first feature patterns 46.

At a subsequent step III, holes (sub-resolution assist features, SRAF) are modeled in polygons of the larger target subassembly (i.e., the large feature patterns 44, which may be referred to as second feature patterns in some embodiments).

At a subsequent step IV, the size of the holes (SRAFs) is varied with a simulation, while the optimal dose for the larger target subassembly (the second features 44) is determined for the simulated features.

At a subsequent step V, the SRAF configuration versus optimal dose ascertained at step IV is analyzed (i.e., data points are compared with one another) to determine a relationship between the simulated configurations of the central regions (50 of FIG. 10) of the second pattern features 44 to the optimal dose of actinic radiation suitable for such second features.

At a final step VI, the SRAF configuration is determined which enables the optimal dose of step V to be approximately the same as that of step II. In other words, the relationship of step V is utilized to ascertain a suitable configuration of the central regions 50 of the second pattern features 44 which enables the optimal dose of actinic radiation through the second pattern features 44 to be comparable to the optimal dose of the actinic radiation through the first pattern features 46. The comparable optimal dose through the modified second pattern features 44 may be within about 5% of the optimal dose of the actinic radiation through the first pattern features 46, within about 1% of the optimal dose through the first pattern features, within about 0.5% of the optimal dose through the first pattern features, etc. In some embodiments, the optimal dose of the actinic radiation through the modified second pattern features 44 may be substantially identical to the optimal dose of the actinic radiation through the first pattern features 46.

Figure 12:
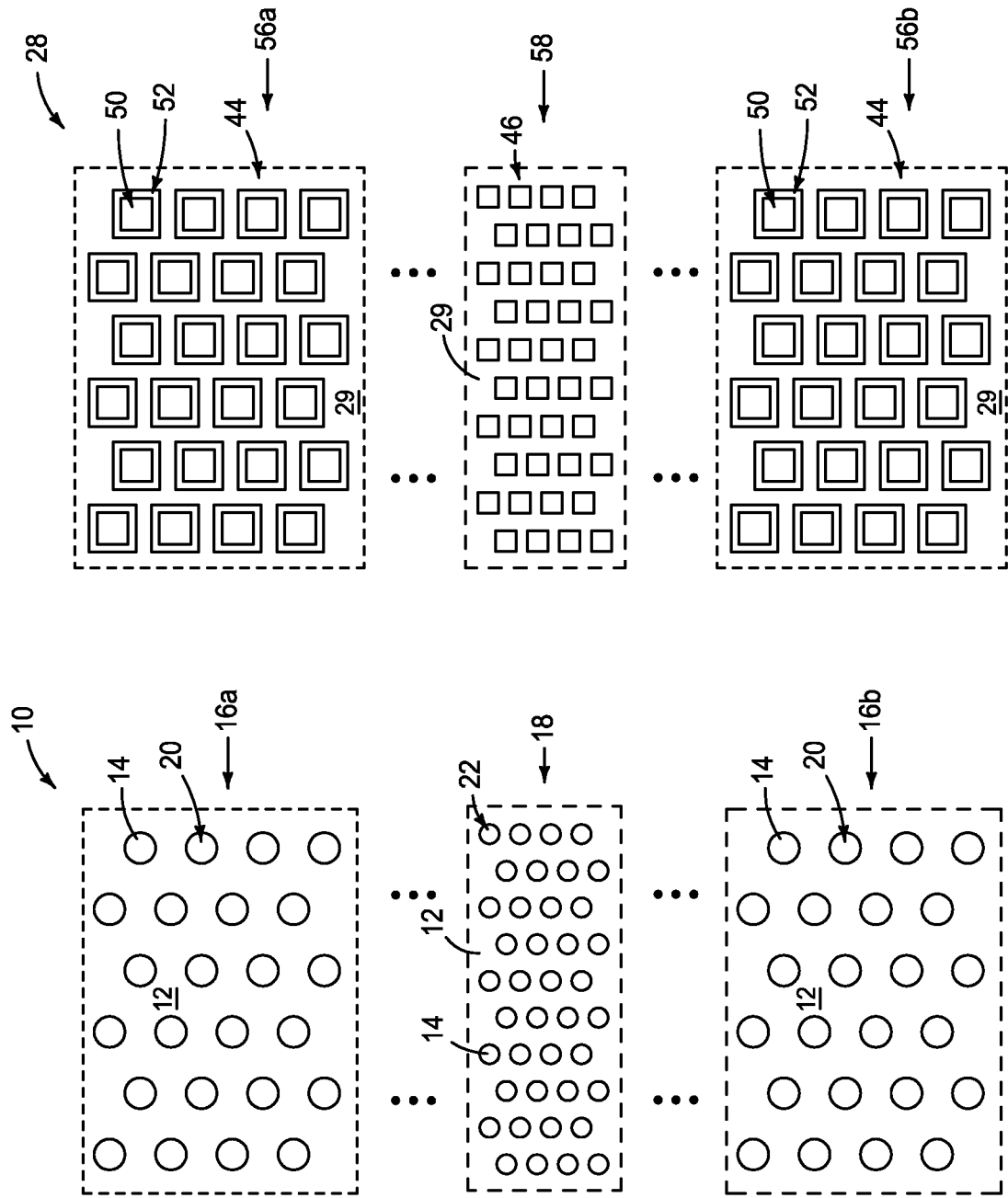
FIG. 12 shows diagrammatic top views of a photoimageable material (left side of the figure), and a reticle (right side of the figure). The reticle may be utilized to form an illustrated pattern within the photoimageable material.

FIG. 12 shows a relationship between an example reticle 28 and a patterned photoimageable material 12 of an assembly 10. The assembly 10 of FIG. 12 is identical to that shown at stage "B" of FIG. 5. The reticle 28 includes regions 56a and 56b which are utilized to pattern the target features 20 of the memory array regions 16a and 16b, respectively. The reticle 28 also includes a region 58 which is between the regions 56a and 56b, and which is utilized to pattern the target features 22 within the interconnect region 18.

The regions 56a and 56b of the reticle 28 comprise the larger pattern features (second pattern features) 44, and the central region 58 comprises the smaller pattern features (first pattern features) 46. The second pattern features 44 of the reticle 28 are modified to include the inriggers (central regions) 50, with such central regions being laterally surrounded by the outer regions 52. The modified feature patterns 44 may have a same optimal dose of actinic radiation (or at least a comparable optimal dose of actinic radiation) to the feature patterns 46 so that a common optimal dose of actinic radiation may be passed through all of the features 44 and 46 to pattern the target features 20 and 22 within the photoimageable material 12 of the assembly 10. Such may advantageously improve the patterning of the arrays of target features 20 and 22 relative to methods which pass sub-optimal doses of actinic radiation through the pattern features of a reticle to attempt to form target features analogous to the features 20 and 22 of the assembly 10. The patterning described herein may be advantageous for increasing levels of integration in that the patterning may enable the target openings 20 and 22 to be formed with high precision and accuracy.

Notably, the second pattern features 44 are shown as squares in FIG. 12 rather than as the rectangles of FIGS. 7 and 10. Such change in the shape of the pattern features is utilized to emphasize that the pattern features may have any suitable shapes, and that the shapes of the pattern features may be tailored for particular applications.

In the FIG. 12 depiction, the columns of second pattern features 44 within regions 56a and 56b of reticle 28 have the second pattern features 44 of alternating columns that are offset relative to the second pattern features of adjacent columns. Similarly, as depicted, first pattern features 46 within central region 58 can also be arranged in columns having first pattern features offset relative to the first pattern features of adjacent columns. This configuration of first and second pattern features can be utilized to produce the pattern of offset target features 22 within the interconnect region 18 and offset target features 20 within array regions 16a and 16b of assembly 10 as depicted. Alternatively, pattern features in one or more of regions 56a, 56b and 58 of reticle 28 can be aligned in both the row direction and the column direction (not shown) to produce corresponding alignment of target features in array regions 16a, 16b and interconnect region 18 of assembly 10. In some embodiments, the pattern of first pattern features 46 will match the pattern of second pattern features 44 with respect to feature alignment (depicted). However, alternate embodiments may have one or more of regions 56a, 56b and 58 having pattern feature alignment that differs relative to each other to produce a pattern of differing relative target features alignment in regions 16a, 16b and 18 of the product assembly 10 (e.g. see FIG. 5). Alternative feature alignment patterns relative to those specifically depicted are contemplated.

The second pattern features 44 are larger than the first pattern features 46, and may be larger by any suitable amount. In some embodiments, the second pattern features 44 are at least about 50% larger than the first pattern features (i.e., the area of the second pattern features is at least about 50% larger than the area of the first pattern features). In some embodiments the second pattern features 44 are at least about twice as large as the first pattern features, at least about 2.5 times as large as the first pattern features, at least about three times as large as the first pattern features, etc.

The openings 20 and 22 of the assembly 10 of FIG. 12 may be formed with processing analogous to that described above with reference to FIGS. 5 and 6. Specifically, actinic radiation may be passed through the reticle 28 to pattern the actinic radiation, and the patterned actinic radiation may impact the photoimageable material 12 to alter solubility of the photoimageable material within a developer solution. Regions of the photoimageable material 12 exposed to the actinic radiation will become either more soluble in the developer solution, or less soluble, depending on whether the photoimageable material is a positive material or a negative material (e.g., positive resist or a negative resist). Regardless, the actinic radiation which passes through the reticle 28 and onto the photoimageable material 12 patterns the first and second target features 20 and 22 within the photoimageable material (specifically, creates a pattern of exposed and unexposed regions within the photoimageable material). The first and second target features 20 and 22 are developed by utilizing developer solution to remove either the exposed regions of the photoimageable material or the unexposed regions of the photoimageable material, depending on whether the photoimageable material is a positive material or a negative material.

Figure 13:
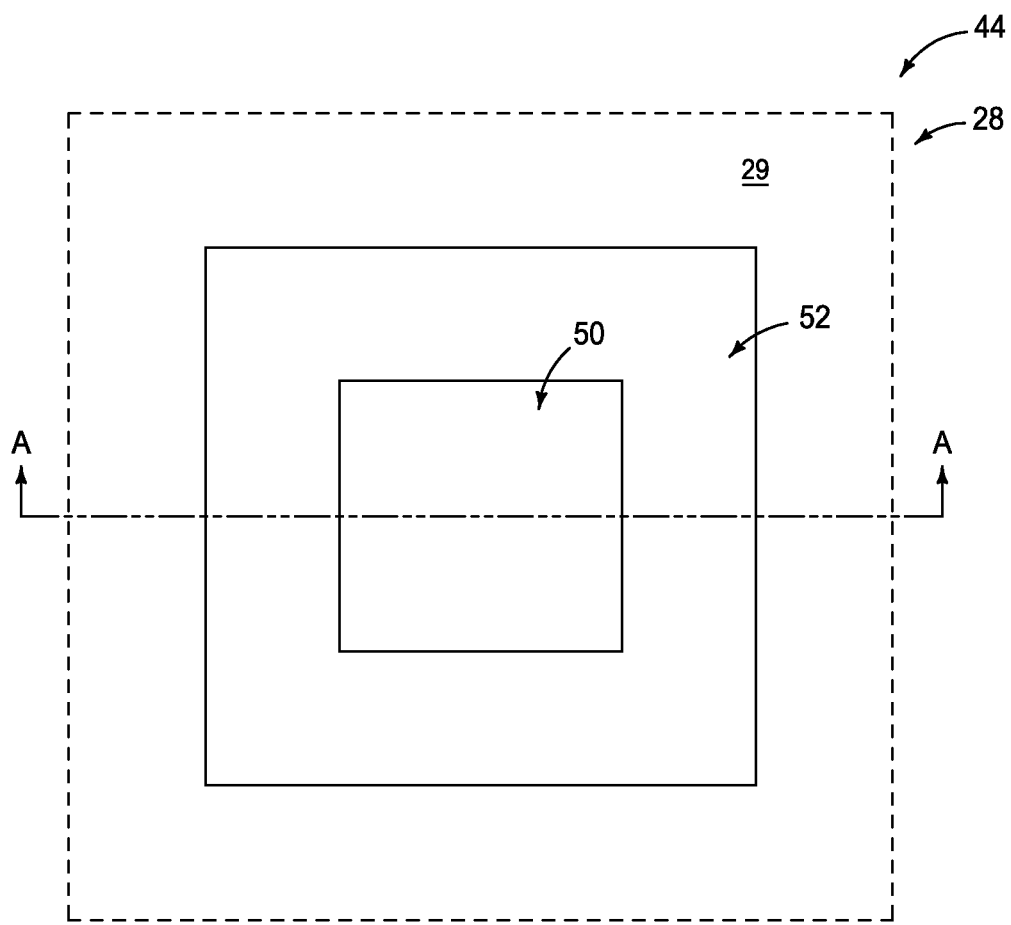
FIGS. 13 and 13A are a diagrammatic top view and a cross-sectional side view, respectively, of an example pattern feature (patterning feature) of an example reticle. The view of FIG. 13A is along the line A-A of FIG. 13.
Figure 14:
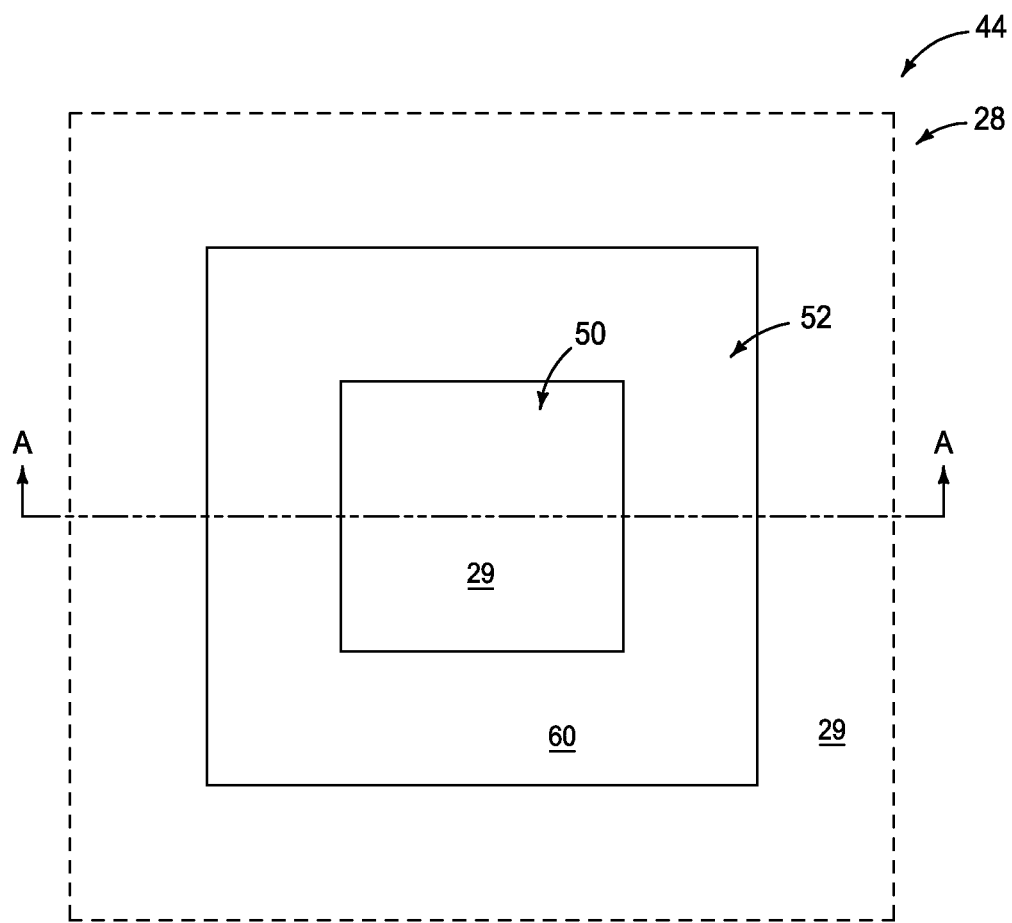
FIGS. 14 and 14A are a diagrammatic top view and a cross-sectional side view, respectively, of an example pattern feature (patterning feature) of an example reticle. The view of FIG. 14A is along the line A-A of FIG. 14.

As discussed above, the central regions 50 of the modified pattern features 44 may be more opaque than the outer regions 52 of such modified pattern features, or may be less opaque than the outer regions 52. FIGS. 13 and 14 illustrate example configurations in which the central regions 50 are more opaque than the outer regions 52 (FIG. 13) and in which the central regions are less opaque than the outer regions 52 (FIG. 14).

Figure 13A:
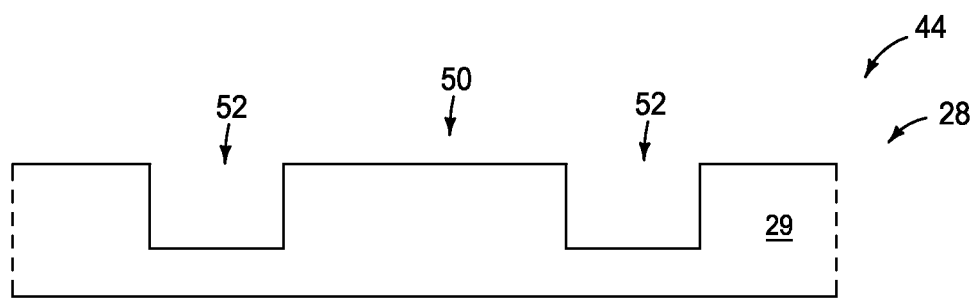

Referring to FIGS. 13 and 13A, the reticle 28 is shown to comprise an opening (window) extending therein which corresponds to the outer region 52. Thus, the outer region 52 is less opaque (more transmissive) than the central region 50.

Figure 14A:
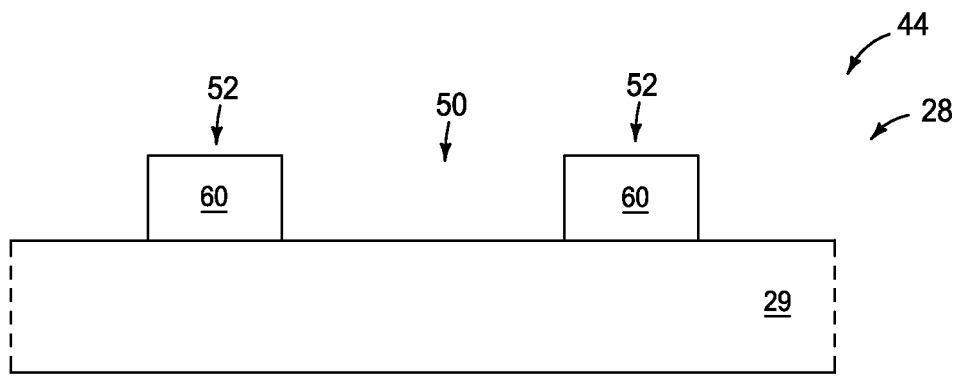

Referring to FIGS. 14 and 14A, the reticle 28 is shown to comprise an opaque blocking material 60 corresponding to the outer region 52. Accordingly, the outer region 52 is more opaque (less transmissive) than the central region 50.

The embodiments of FIGS. 13 and 14 are example embodiments for forming a central region 50 to have different opacity than an outer region 52. Other configurations of the central regions 50 and/or outer regions 52 may be utilized in other applications.

Figure 15A:
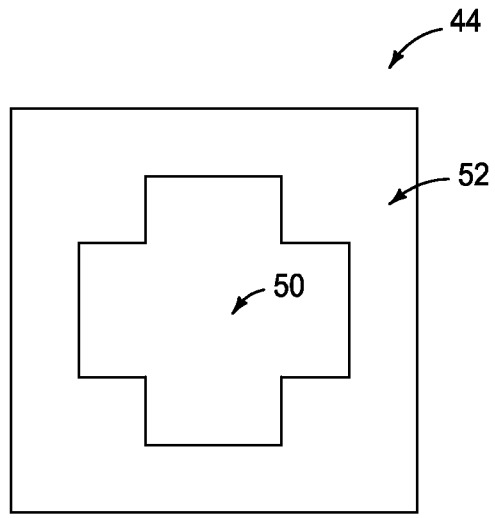
FIGS. 15A-15D are diagrammatic top views of example pattern features (patterning features) of example reticles.
Figure 15B:
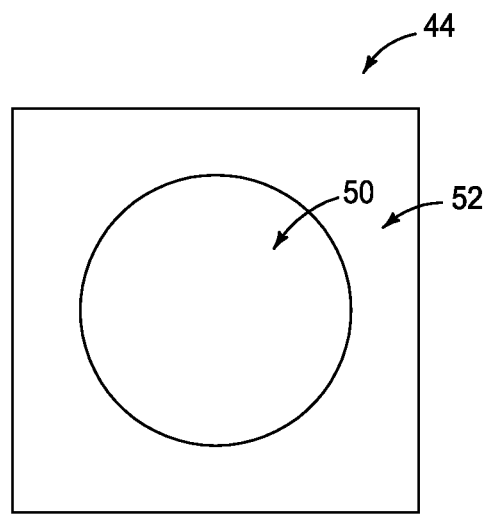
Figure 15C:
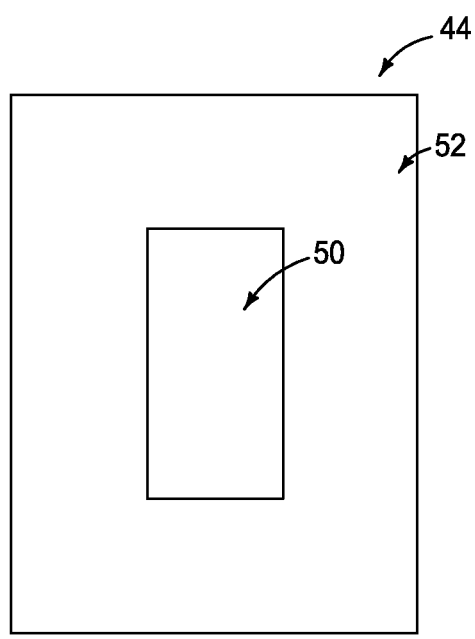
Figure 15D:
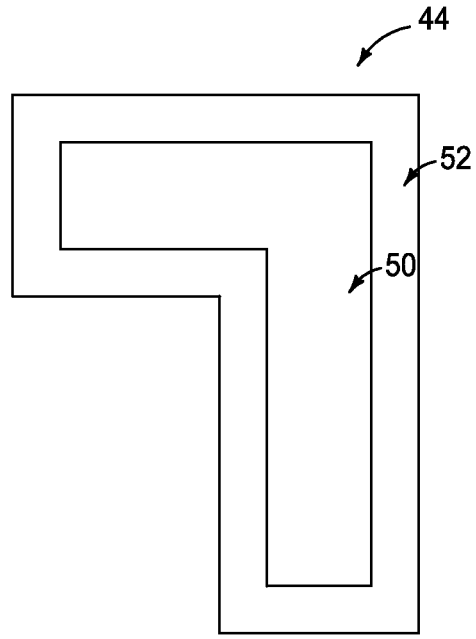

The example embodiments of the modified pattern features 44 described above show the modified pattern features to be four-sided (square or rectangular) and to have the outer regions 52 to be of substantially uniform lateral thickness around the central regions 50. FIGS. 15A-15D illustrate additional example configurations of the modified pattern features 44. FIGS. 15A and 15B illustrate embodiments in which the outer regions 52 do not have substantially uniform lateral thicknesses around the central regions 50. In contrast, FIGS. 15C and 15D show embodiments in which the outer regions 52 do have substantially uniform lateral thicknesses around the central regions 50. FIG. 15D shows an example embodiment in which the modified pattern feature 44 is not four-sided.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a photo-processing method. A photoimageable material is formed over a substrate. The substrate has a first region where first target features are to be formed and has a second region where second target features are to be formed. The first target features are smaller than the second target features. A reticle is configured to pattern the first and second target features within the photoimageable material. The reticle has first pattern features which pattern the first target features and has second pattern features which pattern the second target features. Each of the second pattern features has a configuration which includes a central region and an outer region, with the central region being of different opacity than the outer region. The first and second pattern features have first and second optimal doses of actinic radiation associated therewith. The configuration of the second pattern features balances the second optimal dose of the actinic radiation to be within about 5% of the first optimal dose of the actinic radiation. The actinic radiation is passed through the reticle and onto the photoimageable material to pattern the first and second target features within the photoimageable material.

Some embodiments include a photo-processing method. Photoimageable material is formed over a substrate. A reticle is formed, with the reticle being configured to pattern first and second target features within the photoimageable material. The reticle has first pattern features which pattern the first target features and has second pattern features which pattern the second target features. The second pattern features are larger than the first pattern features. Each of the second pattern features includes a central region and an outer region laterally surrounding the central region, with the central region being of different opacity than the outer region. The central regions are of a suitable configuration so that an optimum dose of actinic radiation through the second pattern features is within about 5% of an optimum dose of the actinic radiation through the first pattern features. The suitable configuration of the central regions of the second pattern features is determined by 1) determining the optimum dose of actinic radiation for the first pattern features, 2) determining a relationship between the configuration of the central regions of the second pattern features to the optimum dose of the actinic radiation for the second pattern features, and 3) utilizing the relationship to ascertain the suitable configuration of the central regions of the second pattern features. The actinic radiation is passed through the reticle and onto the photoimageable material to pattern the first and second target features within the photoimageable material.

Some embodiments include a reticle which includes first pattern features and second pattern features. A first optimal dose of actinic radiation is associated with the first pattern features and a second optimal dose of the actinic radiation is associated with the second pattern features. The second pattern features are larger than the first pattern features. Each of the second pattern features has a configuration which includes a central region laterally surrounded by an outer region, with the central region being of different opacity than the outer region. The configurations of the second pattern features balance the second optimal dose of the actinic radiation to be within about 5% of the first optimal dose of the actinic radiation.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A photo-processing method, comprising:
    forming photoimageable material over a substrate, the substrate having a first region where first target features are to be formed and having a second region where second target features are to be formed, the first target features being smaller than the second target features;
    forming a reticle configured to pattern the first and second target features within the photoimageable material; the reticle having first pattern features which pattern the first target features and having second pattern features which pattern the second target features; each of the second pattern features having a configuration which includes a central region and an outer region, with the central region being of different opacity than the outer region; the first and second pattern features having first and second optimal doses of actinic radiation associated therewith; the configuration of the second pattern features balancing the second optimal dose of the actinic radiation to be within about 5% of the first optimal dose of the actinic radiation; and passing the actinic radiation through the reticle and onto the photoimageable material to pattern the first and second target features within the photoimageable material in a single exposure.

2. The method of claim 1 wherein the second optimal dose of the actinic radiation is within about 1% of the first optimal dose of the actinic radiation.

3. The method of claim 1 wherein the second optimal dose of the actinic radiation is substantially equal to the first optimal dose of the actinic radiation.

4. The method of claim 1 wherein the central regions of the second pattern features comprise from about 5% to about 95% of a total area of the second pattern features.

5. The method of claim 1 wherein the central regions of the second pattern features comprise from about 20% to about 60% of a total area of the second pattern features.

6. The method of claim 1 wherein the substrate is utilized for a NAND memory assembly; wherein the second target features are within a memory array region of the NAND memory assembly, and wherein the first target features are within a second region proximate to the memory array region.

7. The method of claim 6 wherein the memory array region is one of two memory array regions of the NAND memory assembly, and wherein the second region is between the two memory array regions.

8. The method of claim 1 wherein the photoimageable material is a positive resist.

9. The method of claim 1 wherein the photoimageable material is a negative resist.

10. The method of claim 1 wherein the central regions of the second pattern features are sub-resolution assist features.

11. A photo-processing method, comprising:
forming photoimageable material over a substrate;
forming a reticle configured to pattern first and second target features within the photoimageable material; the reticle having first pattern features which pattern the first target features and having second pattern features which pattern the second target features; the second pattern features being larger than the first pattern features; each of the second pattern features including a central region and an outer region laterally surrounding the central region, with the central region being of different opacity than the outer region; the central regions being of a suitable configuration so that an optimum dose of actinic radiation through the second pattern features is within about 5% of an optimum dose of the actinic radiation through the first pattern features; the suitable configuration of the central regions of the second pattern features being determined by 1) determining the optimum dose of actinic radiation for the first pattern features, 2) determining a relationship between the configuration of the central regions of the second pattern features to the optimum dose of the actinic radiation for the second pattern features, and 3) utilizing the relationship to ascertain the suitable configuration of the central regions of the second pattern features; and passing the actinic radiation through the reticle and onto the photoimageable material to pattern the first and second target features within the photoimageable material in a single exposure.

12. The method of claim 11 wherein the optimal dose of the actinic radiation through the second pattern features is within about 1% of the optimal dose of the actinic radiation through the first pattern features.

13. The method of claim 11 wherein the optimal dose of the actinic radiation through the second pattern features is within about 0.5% of the optimal dose of the actinic radiation through the first pattern features.

14. The method of claim 11 wherein the optimal dose of the actinic radiation through the second pattern features is substantially the same as the optimal dose of the actinic radiation through the first pattern features.

15. The method of claim 11 wherein the central regions of the second pattern features comprise from about 5% to about 95% of a total area of the second pattern features.

16. The method of claim 11 wherein the central regions of the second pattern features comprise from about 20% to about 60% of a total area of the second pattern features.

17. The method of claim 11 wherein the first and second pattern features are four-sided features.

18. The method of claim 17 wherein the first and second target features are substantially circular features.

19. The method of claim 11 wherein the central regions of the second pattern features are sub-resolution assist features.

* * * * *